United States Patent

Mishi et al.

(10) Patent No.: US 8,717,838 B1
(45) Date of Patent: May 6, 2014

(54) METHOD AND APPARATUS FOR MEMORY REDUNDANCY

(75) Inventors: Arthur Mishi, Petah Tikva (IL); Zion Dahan, Petah Tikva (IL)

(73) Assignee: Marvell International Ltd., Hamilton (BM)

(*) Notice: Subject to any disclaimer, the term of this patent is extended or adjusted under 35 U.S.C. 154(b) by 600 days.

(21) Appl. No.: 12/899,087

(22) Filed: Oct. 6, 2010

Related U.S. Application Data

(60) Provisional application No. 61/255,041, filed on Oct. 26, 2009.

(51) Int. Cl.
*G11C 7/00* (2006.01)

(52) U.S. Cl.
USPC .............. 365/200; 365/201; 365/185.09

(58) Field of Classification Search
USPC ............................ 365/200, 201, 185.09
See application file for complete search history.

(56) References Cited

U.S. PATENT DOCUMENTS

| | | | |
|---|---|---|---|
| 6,804,135 B1* | 10/2004 | Srinivasan et al. | 365/49.15 |
| 7,206,236 B1* | 4/2007 | Aipperspach et al. | 365/200 |
| 2006/0018157 A1* | 1/2006 | Kawai | 365/185.09 |
| 2009/0180339 A1* | 7/2009 | Kim et al. | 365/200 |

OTHER PUBLICATIONS

U.S. Appl. No. 12/259,022, filed Oct. 27, 2008 in the name of Amir Gabai.

* cited by examiner

*Primary Examiner* — Vu Le
*Assistant Examiner* — Han Yang

(57) ABSTRACT

Aspects of the disclosure provide a memory module including at least one memory block. The memory block includes a memory array and a shift wrapper. The memory array includes regular cell lines and at least a redundant cell line. The regular cell lines and the redundant cell line extend in a bit-line direction, and are ordered in a word-line direction. The shift wrapper interfaces between block inputs/outputs and the regular and redundant cell lines. The shift wrapper is configured to shift a mapping between the block inputs/outputs and the regular and redundant cell lines to bypass a defective cell line that has at least one defective cell, and engage the redundant cell line, while maintaining the order in the word-line direction.

17 Claims, 10 Drawing Sheets

| Input Switch | Receive Inputs From | Output to | Select (Column 63 is defective) |
|---|---|---|---|
| 321(1) | BBLI1 | BL1 | BBLI1 |
| 321(2) | BBLI1, BBLI2 | BL2 | BBLI2 |
| 321(3) | BBLI1, BBLI2, BBLI3 | BL3 | BBLI3 |
| 321(4) | BBLI2, BBLI3, BBLI4 | BL4 | BBLI4 |
| 321(5) | BBLI3, BBLI4, BBLI5 | BL5 | BBLI5 |
| ... | ... | ... | ... |
| 321(62) | BBLI60, BBLI61, BBLI62 | BL62 | BBLI62 |
| 321(63) | BBLI61, BBLI62, BBLI63 | BL63 | X |
| 321(64) | BBLI62, BBLI63, BBLI64 | BL64 | BBLI63 |
| 321(65) | BBLI63, BBLI64 | BL65 | BBLI64 |
| 321(66) | BBLI64 | BL66 | |

FIG. 3B

| Output Switch | Receive Inputs From | Output to | Select (Column 63 is defective) |
|---|---|---|---|
| 325(1) | BL1, BL2, BL3 | BBLO1 | BL1 |
| 325(2) | BL2, BL3, BL4 | BBLO2 | BL2 |
| 325(3) | BL3, BL4, BL5 | BBLO3 | BL3 |
| ... | ... | ... | ... |
| 325(62) | BL62, BL63, BL64 | BBLO62 | BL62 |
| 325(63) | BL63, BL64, BL65 | BBLO63 | BL64 |
| 325(64) | BL64, BL65, BL66 | BBLO64 | BL65 |

FIG. 3C

|  |  | PREVIOUS ROWS ARE NOT DEFECTIVE, n IS NOT DEFECTIVE | ONE PREVIOUS ROW IS DEFECTIVE, n IS NOT DEFECTIVE | TWO PREVIOUS ROWS ARE DEFECTIVE | PREVIOUS ROWS ARE NOT DEFECTIVE, n IS DEFECTIVE | ONE PREVIOUS ROW IS DEFECTIVE, n IS DEFECTIVE |
|---|---|---|---|---|---|---|
| INPUTS TO INPUT SWITCH | Input_enable_1[n] | 0 | 0 | 0 | 1 | 0 |
|  | Input_enable_2[n] | 0 | 0 | 0 | 0 | 1 |
|  | Carry_input_enable_1[n−1] | 0 | 1 | 1 | 0 | 1 |
|  | Carry_input_enable_2[n−1] | 0 | 0 | 1 | 0 | 0 |
| RESULTS OF INPUT SWITCH | S0 | 0 | 1 | 0 | 1 | 0 |
|  | S1 | 0 | 0 | 1 | 0 | 1 |
|  | Multiplexer Output | D0 | D1 | D2 | D1 | D2 |
|  | Carry_input_enable_1[n] | 0 | 1 | 1 | 1 | 1 |
|  | Carry_input_enable_2[n] | 0 | 0 | 1 | 0 | 1 |

FIG. 4B

| OUTPUT SWITCH FUNCTIONALITY | | PREVIOUS ROWS ARE NOT DEFECTIVE, n IS NOT DEFECTIVE | PREVIOUS ROWS ARE NOT DEFECTIVE, n IS DEFECTIVE, n+1 IS NOT DEFECTIVE | PREVIOUS ROWS ARE NOT DEFECTIVE, n IS DEFECTIVE, n+1 IS DEFECTIVE | ONE PREVIOUS ROW IS DEFECTIVE, n AND n+1 ROWS ARE NOT DEFECTIVE | ONE PREVIOUS ROW IS DEFECTIVE, n IS NOT DEFECTIVE, n+1 IS DEFECTIVE | ONE PREVIOUS ROW IS DEFECTIVE AND n IS DEFECTIVE | TWO PREVIOUS ROWS ARE DEFECTIVE |
|---|---|---|---|---|---|---|---|---|
| INPUTS TO OUTPUT SWITCH | Output_enable_1[n] | 0 | 1 | 1 | 0 | 0 | 0 | 0 |
| | Output_enable_2[n] | 0 | 0 | 0 | 0 | 1 | 1 | 0 |
| | Output_enable_1[n+1] | 0/1 | 0 | 0 | 1 | 1 | 0 | 0 |
| | Output_enable_2[n+1] | 0/1 | 0 | 0 | 0 | 0 | 0 | 0 |
| | Carry_output_enable_1[n-1] | 0 | 0 | 0 | 1 | 1 | 0 | 1 |
| | Carry_output_enable_2[n-1] | 0 | 0 | 0 | 1 | 0 | 1 | 0 |
| RESULTS OF OUTPUT SWITCH | S0 | 0 | 1 | 0 | 1 | 0 | 1 | 1 |
| | S1 | 0 | 0 | 0 | 0 | 1 | 1 | 1 |
| | Multiplexer Output | D0 | D1 | D2 | D1 | D2 | D2 | D2 |
| | Carry_output_enable_1[n] | 0 | 1 | 1 | 1 | 1 | 1 | 1 |
| | Carry_output_enable_2[n] | 0 | 0 | 0 | 0 | 0 | 1 | 1 |

FIG. 5B

METHOD AND APPARATUS FOR MEMORY REDUNDANCY

INCORPORATION BY REFERENCE

This application claims the benefit of U.S. Provisional Application No. 61/255,041, "Shift Method for Column Redundancy" filed on Oct. 26, 2009, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor memories are vulnerable to defects introduced by manufacturing process. Generally, a memory includes redundant memory elements. When a memory element is determined to be defective, one of the redundant memory elements is used to replace the defective memory element.

SUMMARY

Aspects of the disclosure provide a memory module including at least a memory block. The memory block includes a memory array and a shift wrapper. The memory array includes regular cell lines and at least one redundant cell line. The regular cell lines and the redundant cell line extend in a bit-line direction, and are ordered in a word-line direction. The shift wrapper interfaces between block inputs/outputs and the regular and redundant cell lines. The shift wrapper is configured to shift a mapping between the block inputs/outputs and the regular and redundant cell lines to bypass a defective cell line that has at least one defective cell, and engage the redundant cell line, while maintaining the order in the word-line direction.

In an embodiment, the memory module includes a controller that provides enable signals to the shift wrapper to shift the mapping. In an example, the enable signals are indicative of the defective cell line.

According to an aspect of the disclosure, the shift wrapper includes a plurality of input switches and a plurality of output switches. The plurality of input switches is respectively coupled to the regular and redundant cell lines. An input switch coupled to a non-defective cell line selectively couples a block input to the non-defective cell line. The plurality of output switches is respectively coupled to the block outputs. An output switch coupled to a block output selectively couples a non-defective cell line to the block output. The controller provides respective enable signals to the plurality of input switches and the plurality of output switches.

In an embodiment, an input switch includes a first multiplexer that selects one out of a number of ordered block inputs. Similarly, an output switch includes a second multiplexer that selects one out of a number of ordered cell lines. The first multiplexer is configured to select one of the ordered block inputs based on at least one of the enable signal provided to the input switch and carry-over enable signals from a neighbor input switch. The second multiplexer is configured to select one of the ordered cell lines based on at least one of the enable signal provided to the output switch and carry-over enable signals from a neighbor output switch.

Aspects of the disclosure also provide an integrated circuit (IC) chip that includes the memory module.

Aspects of the disclosure provide a method of using the memory module. The method includes identifying a defective cell line that has at least one defective cell, and controlling the shift wrapper to shift the mapping between the block inputs/outputs and the regular and redundant cell lines to bypass the defective cell line, and engage the redundant cell line, while maintaining the order in the word-line direction.

In an embodiment, the method includes generating enable signals that are indicative of the defective cell line, and providing the enable signals respectively to the plurality of input switches and the plurality of output switches.

Further, the method includes controlling an input switch coupled to a non-defective cell line to select one of the block inputs by shifting a number corresponding to defective cell lines in previous cell lines. In addition, the method includes controlling an output switch coupled to a block output to select a non defective cell line by shifting a number corresponding to a number of defective cell lines in previous cell lines.

BRIEF DESCRIPTION OF THE DRAWINGS

Various embodiments of this disclosure that are proposed as examples will be described in detail with reference to the following figures, wherein like numerals reference like elements, and wherein:

FIG. 3B shows a table of an implementation example for input switches in the memory block 310 according to an embodiment of the disclosure;

FIG. 3C shows a table of an implementation example for output switches in the memory block 310 according to an embodiment of the disclosure;

FIG. 4B shows a functionality table 424 of the input switch 421 according to an embodiment of the disclosure;

FIG. 5B shows a functionality table 528 of the output switch 525 according to an embodiment of the disclosure.

DETAILED DESCRIPTION OF EMBODIMENTS

Figure 1:
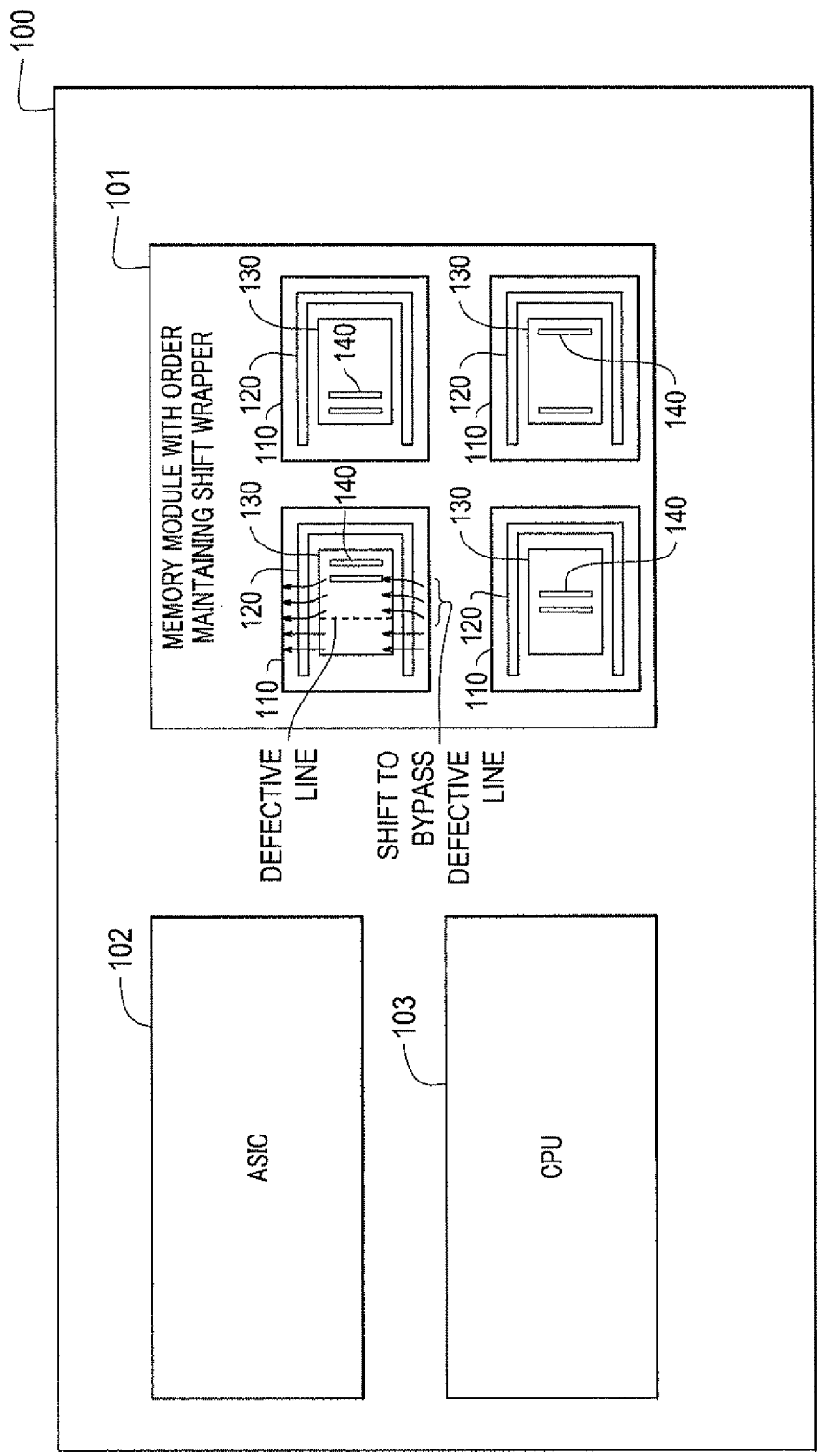
FIG. 1 shows an integrated circuit chip example 100 according to an embodiment of the disclosure.

FIG. 1 shows an integrated circuit (IC) chip example 100 according to an embodiment of the disclosure. The IC chip 100 includes a memory module 101 with order maintaining shift wrapper. Additionally, in an example, the IC chip 100 includes other suitable circuit components, such as a central processing unit (CPU) 130, an application specific integrated circuit (ASIC) module 120, and the like, that are integrated with the memory module 101.

It is noted that, in an example, an IC chip solely includes the memory module 101. The memory module 101 is coupled with various other suitable circuit components, such as a processor module, an ASIC module, and the like, that are located in other IC chips.

In an embodiment, the memory module 101 includes a number of memory blocks 110 and associated peripheral circuits, such as an address decoder (not shown), and the like. In addition, in an example, the memory module 101 includes built-in self-test (BIST) component (not shown) that can be enabled to perform built-in self-test on the memory blocks 110.

According to an embodiment of the disclosure, each memory block 110 is coupled to the associated peripheral circuits via block inputs/outputs (I/O), such as block word-line inputs, block bit-line inputs, block bit-line outputs, and the like. In an example, the memory block 110 is coupled to the associated peripheral circuit via M block word-line inputs, and N block bit-line inputs and N block bit-line outputs, M and N denote positive integer numbers. It is noted that, in an example, the N block bit-line inputs and the N block bit-line outputs share same physical components that are referred to as N block bit-line I/O.

A memory block 110 includes memory cells arranged in a memory array 130 having at least two dimensions, and a shift wrapper 120 that interfaces the block I/O and array I/O, such as array word-lines and array bit-lines. In an embodiment, the two dimensions are referred to as a word-line dimension and a bit-line dimension. Generally, a line of memory cells extended in the word-line dimension is selectable by an array word-line, and a line of memory cells extended in the bit-line dimension receives or outputs data to an array bit-line (or a pair of array bit-lines). Further, in an example, the array word-line extents in an X direction, and the array bit-line extends in a Y direction. Then, a line of memory cells extended in the word-line dimension is referred to as a row of memory cells, and a line of memory cells extended in the bit-line dimension is referred to as a column of memory cells.

According to an embodiment of the disclosure, the memory array 130 has redundancy. The shift wrapper 120 suitably shifts a mapping between the block I/O to the array I/O to bypass defective cells while maintaining the order of the bit lines. In an example, the memory array 130 includes memory cells arranged in M rows by N+R columns, where R denotes an integer number. Further, the memory array 130 includes M array word-lines, N+R array bit-lines. Each array word-line couples a row of memory cells, and each array bit-line couples to a couples to a column of memory cells. It is noted that, in an example, each array bit-line includes a pair of physical lines extended in the bit-line dimension.

Thus, while the memory block 110 has M block word-line inputs, and N block bit-line I/O, the memory array 130 has M array word-lines, and N+R array bit-lines. The M block word-line inputs are respectively coupled to the M array word-lines. Further, the shift wrapper 120 respectively couples the N block bit-line I/O to selected N array bit-lines out of N+R array bit-lines by suitably shifting the mapping between the block bit-line I/O and the array bit-lines to bypass a defective column having at least a defective cell. In an embodiment, while bypassing the defective column(s), the physical order of the non-defective columns and the redundant columns that correspond to the block bit-line I/O is maintained.

Specifically, among the N+R columns, R columns 140 are referred to as redundant columns, and the rest of the columns are referred to as regular columns. It is noted that the R redundant columns 140 are not necessarily physically grouped together. In an embodiment, the R redundant columns 140 are interleaved with the N regular columns. For example, the memory array 130 includes 66 columns that are physically placed in an order of 1 to 66. Within the 66 columns, two columns are redundant columns, and the rest of the 66 columns are regular columns. In an example, the first two columns according to the physical placement of the 66 columns are the redundant columns 140. In another example, the last two columns ($65^{th}$ and $66^{th}$) according to the physical placement of the 66 columns are the redundant columns 140. In another example, the first column and the last column according to the physical placement of the 66 columns are the redundant columns 140. In another example, the $33^{rd}$ column and the $34^{th}$ column according to the physical placement of the 66 columns are the redundant columns 140.

During operation, for example, when the N regular columns are not affected by defects, in other words, the N regular columns are non-defective columns, the shift wrapper 120 respectively couples the N block bit-line I/O to the array bit-lines of the N regular columns according to a mapping. However, when a regular column is defective, in other words, the regular column includes at least one defective cell, the shift wrapper 120 suitably shifts the mapping, or a portion of the mapping, to bypass the defective column.

In an example, the memory array 130 includes 66 columns. Among the 66 columns, the $65^{th}$ and $66^{th}$ columns are redundant columns, and the rest of the 66 columns are regular columns. When the regular columns are non-defective columns, the $1^{st}$ to $64^{th}$ block bit-line I/O are respectively coupled to the array bit-lines of the $1^{st}$ to $64^{th}$ columns.

When, for example, the $7^{th}$ column is defective, the shift wrapper 120 shifts the mapping of the $7^{th}$ to the $64^{th}$ block bit-line I/O by one to larger side. Thus, the $7^{th}$ to $64^{th}$ block bit-line I/O are respectively coupled to the array bit-lines of the $8^{th}$ to $65^{th}$ columns.

When, for example, the $7^{th}$ column and the $10^{th}$ column are defective, the shift wrapper 120 shifts the mapping of the $7^{th}$ to the $8^{th}$ block bit-line I/O by one to larger side, and shifts the mapping of the $9^{th}$ to the $64^{th}$ block bit-line I/O by two to the larger side. Thus, the $7^{th}$ to $8^{th}$ block bit-line I/O are respectively coupled to the array bit-lines of the $8^{th}$ to $9^{th}$ columns, and the $9^{th}$ to the $64^{th}$ block bit-line I/O are respectively coupled to the array bit-lines of the $11^{th}$ to $66^{th}$ columns.

In another example, the memory array 130 includes 66 columns. Among the 66 columns, the $33^{rd}$ and $34^{th}$ columns are redundant columns, and the rest of the columns are regular columns. When the regular columns are non-defective columns, $1^{st}$ to $32^{nd}$ block bit-line I/O are respectively coupled to the array bit-lines of the $1^{st}$ to $32^{nd}$ columns, and the $33^{rd}$ to $64^{th}$ block bit-line I/O are respectively coupled to the array bit-lines of the $35^{th}$ to $66^{th}$ columns.

When, for example, the $7^{th}$ column is defective, the shift wrapper 120 shifts the mapping of the $7^{th}$ to the $32^{nd}$ block bit-line I/O by one to larger side. Thus, the $7^{th}$ to $32^{nd}$ block bit-line I/O are respectively coupled to the array bit-lines of the $8^{th}$ to $33^{rd}$ columns.

When, for example, the $7^{th}$ column and the $10^{th}$ column are defective, the shift wrapper 120 shifts the mapping of the $7^{th}$ to the $8^{th}$ block bit-line I/O by one to larger side, and shifts the mapping of the $9^{th}$ to the $32^{nd}$ block bit-line I/O by two to the larger side. Thus, the $7^{th}$ to $8^{th}$ block bit-line I/O are respectively coupled to the array bit-lines of the $8^{th}$ to $9^{th}$ columns, and the $9^{th}$ to the $32^{nd}$ block bit-line I/O are respectively coupled to the array bit-liens of the $11^{th}$ to $34^{th}$ columns.

When, for example, the $7^{th}$ column and the $37^{th}$ column are defective, the shift wrapper 120 shifts the mapping of the $7^{th}$ to the $32^{nd}$ block bit-line I/O by one to larger side, and shifts the mapping of the $33^{rd}$ to the $35^{th}$ block bit-line I/O by one to the smaller side. Thus, the $7^{th}$ to $32^{nd}$ block bit-line I/O are respectively coupled to the array bit-lines of the $8^{th}$ to $33^{rd}$ columns, and the $33^{rd}$ to the $35^{th}$ block bit-line I/O are respectively coupled to the array bit-liens of the $34^{th}$ to $36^{th}$ columns.

It is noted that the above description is merely examples. A memory block can include any number of redundant columns. The redundant columns can be interleaved with regular columns at any positions. A defective cell can exist at any columns.

According to an embodiment of the disclosure, the shift wrapper 120 is configured based on a defective status of the memory array 130. In an example, the shift wrapper 120 receives a signal that is indicative of the defective status from an external tester or a BIST module on the same chip. Then, the shift wrapper 120 is suitably configured based on the signal. According to an aspect of the disclosure, the shift wrapper 120 is configured during manufacturing, for example, after a test of the memory array 130. According to another aspect of the disclosure, the shift wrapper 120 is configured at the user end when the BIST module detests a defective column, for example.

Figure 2:
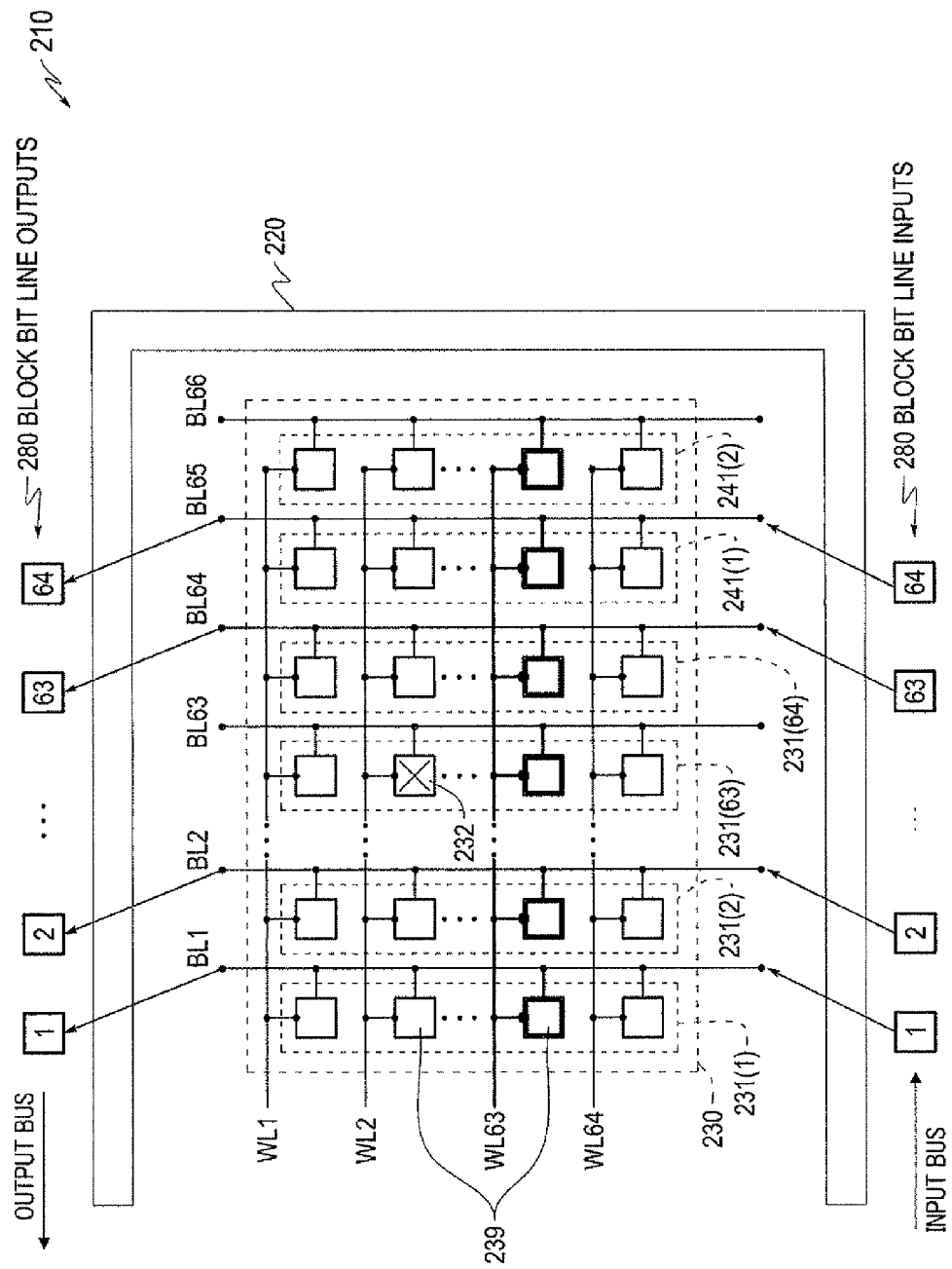
FIG. 2 shows a block diagram of a memory block example 210 according to an embodiment of the disclosure.

FIG. 2 shows a block diagram of a memory block example 210 according to an embodiment of the disclosure. The memory block 210 includes a memory array 230 and a shift wrapper 220. The memory array 230 includes memory cells 239 arranged in an array having 64 rows by 66 columns, 64 array word-lines WL1-WL64, and 66 array bit-lines BL1-BL66. In the FIG. 2 example, the word-lines WL1 to WL64 extend in the X-axis, and the bit-lines BL1-BL66 extend in the Y-axis. The 64 rows of memory cells extend in the same dimension as the word-lines WL1-WL64. The 66 columns of memory cells extend in the same dimension as the bit-lines BL1-BL66. Each memory cell is coupled to a word-line and a bit-line. The word-line receives a word-line input that enables or disables the memory cell. The bit-line provides an input to the memory cell or receives an output from the memory cell.

Further, the memory block 210 has redundancy, and the shift wrapper 220 suitably bypasses a defective column by shifting a mapping between block bit-line I/O and array bit-lines. Specifically, in an example, the memory block 210 receives 64 block bit-line inputs 270 from an input bus, and generates 64 block bit-line outputs 280 for transmitting to an output bus. In the FIG. 2 example, the memory array 230 includes 66 columns 231(1) to 231(64), and 241(1) and 241(2) that are physically placed in an order shown in the FIG. 2. The two columns 241(1) and 241(2) are redundant columns, and the rest of the columns 231(1) to 231(64) are regular columns. Then, the shift wrapper 220 respectively couples the 64 block bit-line inputs and the 64 block bit-line outputs to 64 regular columns according to a mapping, and suitably shifts the mapping to bypass a defective column having at least a defective cell, and to engage a redundant column according to the physical placement order.

To configure the memory block 210, for example, when the 64 regular columns 231(1) to 231(64) are all non-defective columns, in an embodiment, the shift wrapper 220 respectively couples the 64 block bit-line inputs and outputs to the array bit-lines of the 64 regular columns 231(1) to 231(64) according to a mapping. However, when a regular column is defective, the shift wrapper 120 suitably shifts the mapping to bypass the defective column.

In an example, the memory cell 232 in the regular column 231(63) is defective, thus the column 231(63) is a defective column. The shift wrapper 120 shifts the mapping of the $63^{rd}$ to the $64^{th}$ block bit-line I/O by one to larger side. Thus, the $63^{rd}$ to $64^{th}$ block bit-line I/O are respectively coupled to the array bit-lines of the $64^{th}$ column 231(64) to the $65^{th}$ column 241(1).

After configuration, the memory block 210 is used as a non-defective memory block. For example, during a write operation, when a word-line, such as the word-line WL63, is at an enable level, the $63^{rd}$ row of memory cells is enabled. Further, the block bit line inputs 270 receive 64 bits of data, for example, from the input bus. Respectively, the shift wrapper 220 drives the 64 bits to the array bit lines BL1 to BL62, and BL64 to BL65. The 64 bits are written to memory cells on the $63^{rd}$ row at columns 231(1) to 231(62), 231(64) and 241 (1). Thus, the defective column $63^{rd}$ is bypassed.

On the other hand, during a read operation, when a word-line, such as the word-line WL63, is at an enable level, the $63^{rd}$ row of memory cells is enabled. The data in the memory cells of the $63^{rd}$ row are output to the coupled bit lines BL1-BL66. However, the shift wrapper 220 respectively couples BL1 to BL62 and BL64 to 13L65 to the block bit line outputs 280. Thus, the defective column $63^{rd}$ is bypassed.

It is noted that the memory block 210 is merely an example; a memory block can include any number of redundant columns. Further, the redundant columns can be interleaved with regular columns at any positions. A defective cell can exist at any columns.

Figure 3A:
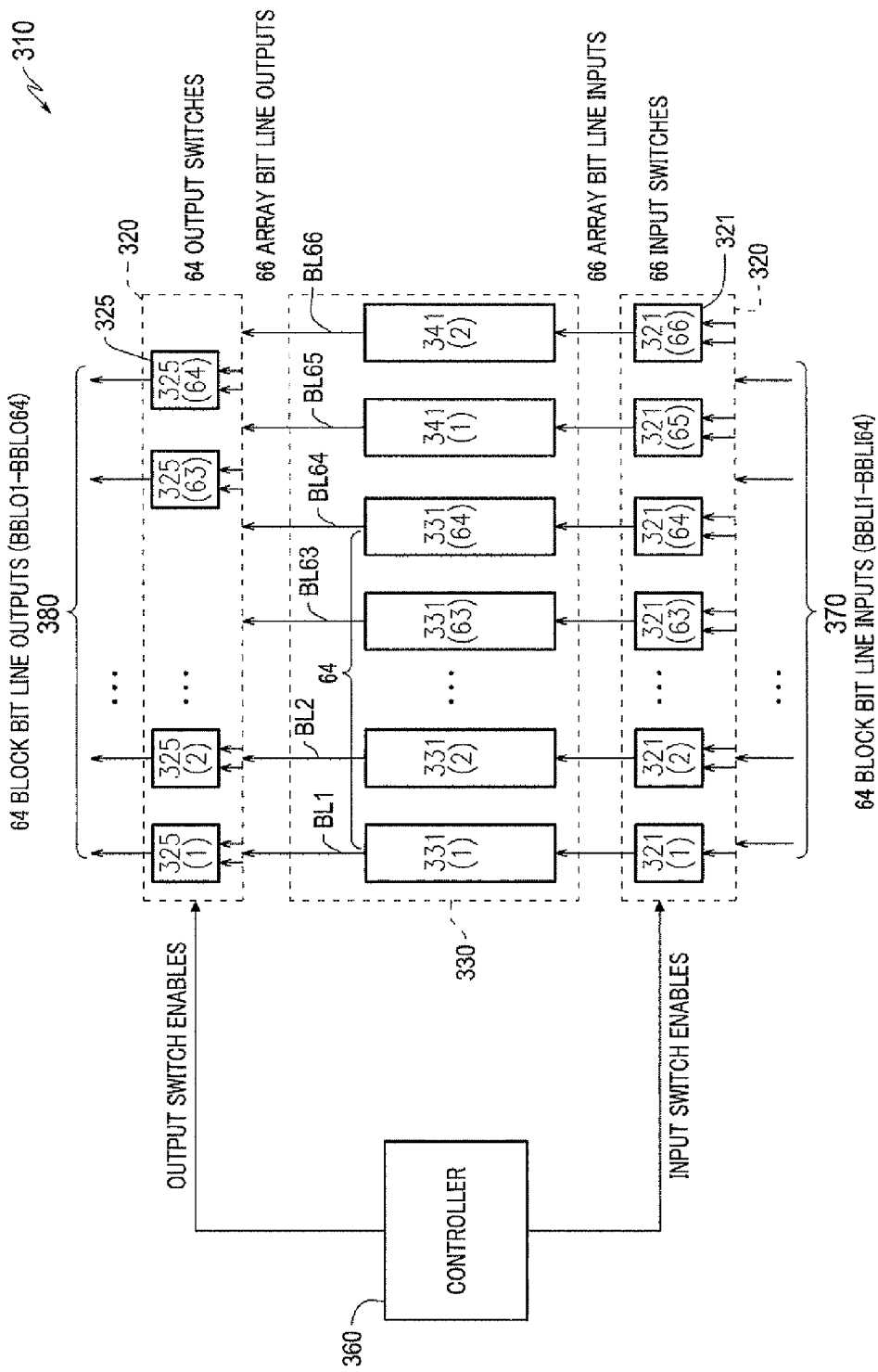
FIG. 3A shows another block diagram of a memory block example 310 according to an embodiment of the disclosure.

FIG. 3A shows another block diagram of a memory block example 310 according to an embodiment of the disclosure. The memory block 310 includes a memory array 330 and a shift wrapper 320. The memory array 330 includes 66 array bit-lines BL1-BL66 extended in the Y-axis, and 66 columns 331(1) to 331(64) and 341(1) and 341(2) of memory cells that are respectively coupled to 66 array bit-lines BL1-BL66. The 66 columns 331(1) to 331(64) and 341(1) and 341(2) of memory cells extend in the same dimension as the bit-lines BL1-BL66. Each bit-line can be configured to provide an input to an enabled memory cell in the coupled column or receive an output from an enabled memory cell in the coupled column.

Further, the memory block 310 has redundancy, and the shift wrapper 320 suitably bypasses a defective column by shifting a mapping between block bit-line I/O and array bit-lines. Specifically, in an example, the memory block 310 receives 64 block bit-line inputs 370, and outputs 64 block bit-line outputs 380.

Among the 66 columns 331(1) to 331(64), and 341(1) to 341(2), the two columns 341(1) and 342(2) are redundant columns, and the rest of the columns 331(1) to 331(64) are regular columns. The shift wrapper 220 respectively couples the 64 block bit-line inputs and the 64 block bit-line outputs to 64 selected array bit-lines by suitably shifting the mapping to bypass a defective column having at least a defective cell.

Specifically, the shift wrapper 320 includes 66 input switches 321(1) to 321(66) that respectively drive the 66 array bit-lines BL1 to BL66. Each of the input switches receives one or more block bit-line inputs, selects one block bit-line input, and drives the selected block bit-line input to the corresponding array bit-line.

In addition, the shift wrapper 320 includes 64 output switches 325(1) to 325(64) that respectively drive the 64 block bit-line outputs 380. Each of the output switches receives data from one or more array bit-lines, selects data from one array bit-line, and drives the selected data to the corresponding block bit-line output 380.

In an embodiment, the input switches 321(1) to 321(66) and the output switches 325(1) to 325(64) receive enable signals, such as input_switch_enables, output_switch_enables, and the like, from a controller 360, and make selections based on the received enable signals.

In an example, each of the input switches 321(1) to 321(66) receives an enable signal from the controller 360, and makes the selection based on the enable signal. In another example, each of the input switches 321(1) to 321(66) receives an enable signal from the controller 360 and a carry over enable signal from a neighbor input switch, such as a previous input switch. The input switch makes the selection based on the received enable signal from the controller 360 and the carry over enable signal from the previous input switch.

Similarly, in an example, each of the output switches 325(1) to 325(64) receives an enable signal from the controller 360, and makes the selection based on the enable signal. In another example, each of the output switches 325(1) to 325(64) receives an enable signal from the controller 360 and a carry over enable signal from a neighbor output switch, such as a previous output switch. The output switch makes the selection based on the received enable signal from the controller 360 and the carry over enable signal from the previous output switch. Further, in an example, the output switch also makes the selection based on the enable signal to one or more following output switches.

In an embodiment, the controller 360 receives a test result from an external tester or an on chip BIST module, and generates the enable signals based on the test result. In another embodiment, the controller 360 includes a memory element that stores the test result. Then, the controller 360 generates the enable signals based on the stored test result.

FIG. 3B shows a table 390 of an implementation example of input switches according to an embodiment of the disclosure and FIG. 3C shows a table 395 of an implementation example of output switches according to an embodiment of the disclosure.

The table 390 (in FIG. 3B) includes field 391-field 394. Field 391 specifies names of the input switches. Field 392 lists block bit-line inputs that are received by the corresponding the input switch in field 391. Field 393 specifies the array bit-line that is driven by the corresponding input switch in field 391. Field 394 specifies a selected block bit-line input by the corresponding input switch in field 391 when the $63^{rd}$ column is defective.

The table 395 (in FIG. 3C) includes field 396-field 399. Field 396 specifies names of the output switches. Field 397 lists array bit-lines that provide data to the corresponding output switch in field 396. Field 398 specifies the block bit-line output that is driven by the corresponding output switch in field 396. Field 399 specifies a selected array bit-line by the corresponding output switch in field 396 when the $63^{rd}$ column is defective.

It is noted that the memory block 310 is merely an example; a memory block can include any number of redundant columns. Further, the redundant columns can be interleaved with regular columns at any positions. A defective cell can exist at any columns. A shift wrapper can use any suitable shifting technique to shift the mapping between block I/Os and array bit-lines.

Figure 4A:
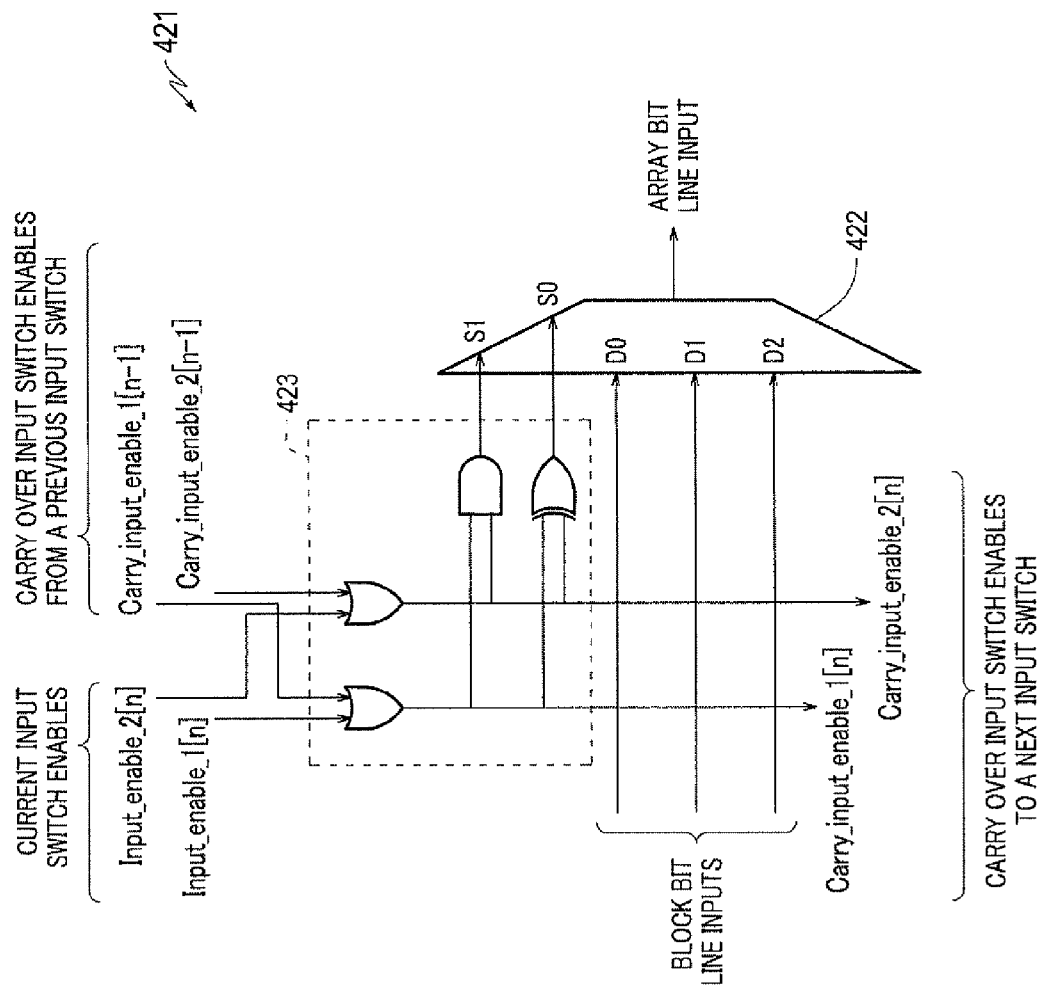
FIG. 4A shows a block diagram of an input switch example 421 according to an embodiment of the disclosure.

FIG. 4A shows a block diagram of an input switch example 421 according to an embodiment of the disclosure. The input switch 421 includes a multiplexer 422. The multiplexer 422 receives block bit-line inputs as the selectable inputs D0-D2, and makes a selection based on selection signals S0-S1. In an embodiment, the selection signals S0-S1 are directly provided by a controller, such as the controller 360, in the form of a 2-bit enable signal, for example. In an example, the controller 360 determines enable signals for all the input switches 321(1) to 321(66) based on a defective status of the memory array 330.

In another embodiment, the selection signals S0-S1 are determined based on a logic circuit 423. The logic circuit 423 receives enable signals from a controller, such as the controller 360, and carry over enable signals from a neighbor input switch. Then, the logic circuit 423 determines the selection signals S0-S1 based on the received enable signals from the controller 360 and the carry over enable signals from the neighbor input switch.

In an example, when the regular columns 331(1) to 331(64) are non-defective, the controller 360 provides 66 bits of "0" (e.g., relatively low voltage) as input_enable_1 [1:66] and 66 bits of "0" (e.g., relatively low voltage) as input_enable_2 [1:66]. When a single column, such as the $7^{th}$ column is defective, is defective, the controller 360 sets input_enable_1 [7] to be "1" (e.g., relatively high voltage), and keeps the rest of enable signals to be "0". When two columns, such as the $7^{th}$ column and the $10^{th}$ column, are defective, the controller 360 sets input_enable_1 [7] to be "1" (e.g., relatively high voltage), sets input_enable_2 [10] to be "1" (e.g., relatively high voltage), and keeps the rest of enable signals to be "0".

FIG. 4B shows a functionality table 424 of the input switch 421 according to an embodiment of the disclosure. Each column in the functionality table 424 corresponds to a defective scenario. The column includes inputs to the input switch 421, intermediate results in the input switch 421 and outputs from the input switch 421 under the defective scenario according to the input switch 421 in FIG. 4A.

In the FIG. 4A example, the functionality is implemented according to the combinational logic shown in the logic circuit 423. It is noted that any suitable circuits can be used to implement the functionality of the input switch 421.

It is also noted that the input switch 421 is merely an example for a memory block having up to two redundant columns. The input switch 421 can be suitably modified for a memory block having any other number of redundant columns. In an example, when a memory block has R (R is any suitable positive integer number) redundant columns, the controller 360 provides an R-bit enable signal to the input switch 421. The input switch 421 generates the selection signal based on the enable signal. The selection signal is used to control the multiplexer 422 to select one out of R+1 block bit-line inputs.

Figure 5A:
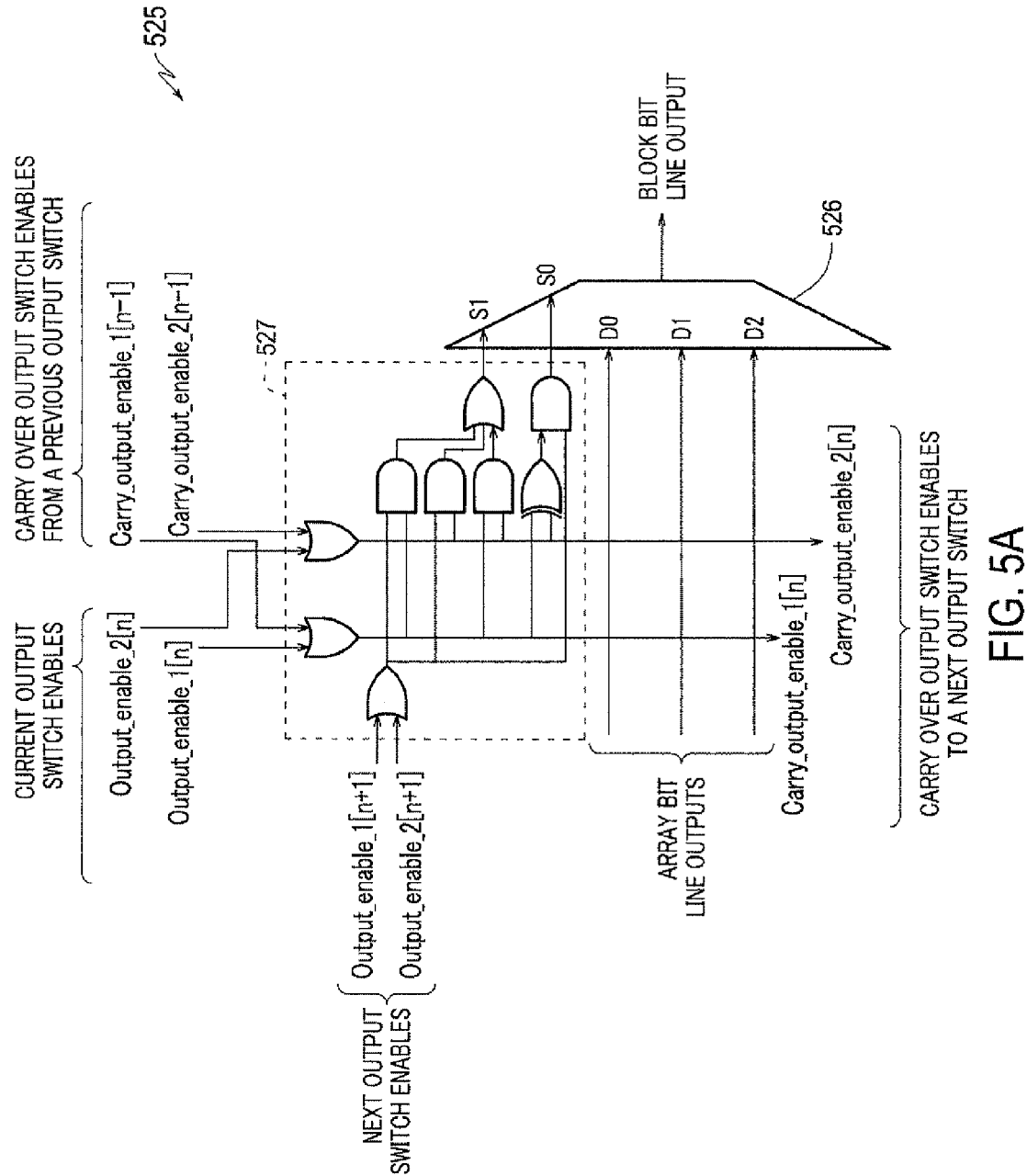
FIG. 5B shows a block diagram of an output switch example 525 according to an embodiment of the disclosure.

FIG. 5A shows a block diagram of an output switch example 525 according to an embodiment of the disclosure. The output switch 525 includes a multiplexer 526. The multiplexer 526 receives data from array bit-lines as the selectable inputs D0-D2, and makes a selection based on selection signals S0-S1. In an embodiment, the selection signals S0-S1 are directly provided by a controller, such as the controller 360, in the form of a 2-bit enable signal, for example. In an example, the controller 360 determines enable signals for all the output switches 325(1) to 325(64) based on a defective status of the memory array 330.

In another embodiment, the selection signals S0-S1 are determined based on a logic circuit 527. The logic circuit 527 receives enable signals from a controller, such as the controller 360, and carry over enable signals from a neighbor output switch. Then, the logic circuit 527 determines the selection signals S0-S1 based on the received enable signals from the controller 360 and the carry over enable signals from the neighbor output switch.

In an example, when the regular columns 331(1) to 331(64) are non-defective, the controller 360 provides 64 bits of "0" (e.g., relatively low voltage) as output_enable_1 [1:64] and 64 bits of "0" (e.g., relatively low voltage) as output_enable_2 [1:64]. When a single column, such as the $7^{th}$ column is defective, is defective, the controller 360 sets output_enable_1 [7] to be "1" (e.g., relatively high voltage), and keeps the rest of enable signals to be "0". When two columns, such as the $7^{th}$ column and the $10^{th}$ column, are defective, the controller 360 sets output_enable_1 [7] to be "1" (e.g., relatively high voltage), sets output_enable_2 [10] to be "1" (e.g., relatively high voltage), and keeps the rest of enable signals to be "0".

FIG. 5B shows a functionality table 528 of the output switch 525 according to an embodiment of the disclosure. Each column in the functionality table 528 corresponds to a defective scenario. The column includes inputs to the output switch 525, intermediate results in the output switch 525 and outputs from the output switch 525 under the defective scenario.

In the FIG. 5A example, the functionality is implemented according to the combinational logic shown in the logic circuit 527. It is noted that any suitable circuits can be used to implement the functionality of the output switch 525.

It is also noted that the output switch 525 is merely an example for a memory block having up to two redundant columns. The output switch 525 can be suitably modified for a memory block having any other number of redundant columns. In an example, when a memory block has R (R is any suitable positive integer number) redundant columns, the controller 360 provides an R-bit enable signal to the output switch 525. The output switch 525 generates the selection signal based on the R-bit enable signal. The selection signal is used to control the multiplexer 526 to select one out of R+1 array bit-lines.

It is noted that the circuits in FIG. 4A and FIG. 5A are suitable for up to 2 defective columns in a memory array. The circuits can be suitably adjusted for use of more than 2 defective columns.

Figure 6:
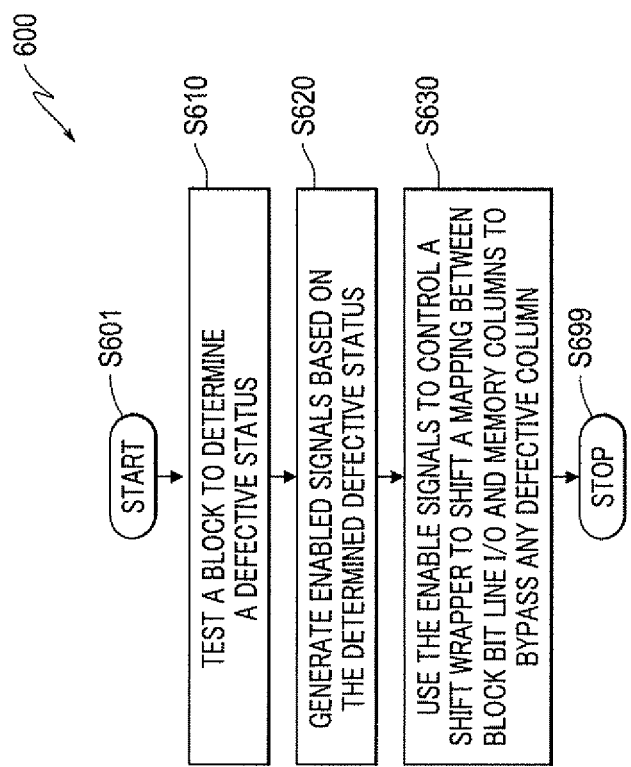
FIG. 6 shows a flowchart outlining a process example 600 for using a memory block with redundancy according to an embodiment of the disclosure.

FIG. 6 shows a flowchart outlining a process example 600 for using a memory module, such as the memory module 101, according to an embodiment of the disclosure. The process starts at S601, and proceeds to S610.

At S610, a memory block, such as the memory block 210, in the memory module 101 that includes a plurality of memory blocks is tested to determine a detective status. In an embodiment, the memory block 210 is tested at an IC manufacturing facility, for example, by a tester. The defective status is saved in a storage element. In another embodiment, the memory block 210 is tested at the user end, for example, by a BIST module that is integrated with the memory block 210. The defective status indicates whether the regular columns are non-defective. When the regular columns include defective cells, the defective status indicates which columns are defective.

At S620, enable signals are generated based on the determined defective status. In an embodiment, the memory module 101 includes a controller, such as the controller 360. The controller 360 generates the enable signals based on the determined defective status.

At S630, the enable signals are used to configure a shift wrapper, such as the shift wrapper 320, to suitably shift the mapping between the block bit-line I/O and memory columns to bypass any defective columns. The process then proceeds to S699 and terminates.

It is noted that, in an embodiment, the shift wrapper 320 is permanently configured. In another embodiment, the shift wrapper 320 is reconfigurable.

It is also noted that the terms "rows" and "columns" for describing memory cell lines in a memory array are used when the word-lines of the memory array extend in the X-axis, and the bit-lines of the memory array extend in the Y-axis. The terms can be suitably adjusted when the word-lines and bit-lines extend in different dimensions.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. A memory module comprising:
at least a memory block that includes:
a memory array having regular columns and at least one redundant column, the regular columns and the redundant column extending in a bit-line direction, and being ordered in a word-line direction; and
a shift wrapper that interfaces between block inputs/outputs and the regular and redundant columns, the shift wrapper configured to shift a mapping between the block inputs/outputs and the regular and redundant columns to bypass a defective column that has at least one defective cell, and engage the redundant column, while maintaining the order in the word-line direction, and the shift wrapper including:
a plurality of input switches respectively coupled to the regular and redundant columns, an input switch coupled to a non-defective column and configured to selectively couple a block input to the non-defective column, and
a plurality of output switches respectively coupled to the block outputs, an output switch coupled to a block output and configured to selectively couple a non-defective column to the block output.

2. The memory module of claim 1, further comprising:
a controller configured to provide enable signals to the shift wrapper to shift the mapping.

3. The memory module of claim 1, wherein the controller is configured to provide the enable signals that are indicative of the defective column.

4. The memory module of claim 1, wherein
the controller is configured to provide respective enable signals to the plurality of input switches and the plurality of output switches.

5. The memory module of claim 4, wherein
an input switch includes a first multiplexer that selects one out of a number of ordered block inputs; and
an output switch includes a second multiplexer that selects one out of a number of ordered columns.

6. The memory module of claim 5, wherein
the first multiplexer is configured to select one of the ordered block inputs based on at least one of the enable signal provided to the input switch and a carry-over enable signal from a neighbor input switch.

7. The memory module of claim 5, wherein
the second multiplexer is configured to select one of the ordered columns based on at least one of the enable signal provided to the output switch and a carry-over enable signal from a neighbor output switch.

8. A method of using a memory module, comprising:
identifying in a memory block of the memory module a defective column that has at least one defective cell, the memory block including:
a memory array having regular columns and at least one redundant column, the regular columns and the redundant column extending in a bit-line direction, and being ordered in a word-line direction;
controlling a shift wrapper to shift a mapping between block inputs/outputs and the regular and redundant columns to bypass the defective column, and engage the redundant column, while maintaining the order in the word-line direction;

generating enable signals that are indicative of the defective column; and providing the enable signals respectively to a plurality of input switches that are respectively coupled to the regular and redundant columns, and to a plurality of output switches that are respectively coupled to the block outputs.

9. The method of claim 8, further comprising:
controlling an input switch coupled to a non-defective column to select one of the block inputs by shifting a number corresponding to defective columns in previous columns.

10. The method of claim 9, further comprising:
controlling an output switch coupled to a block output to select a non-defective column by shifting a number corresponding to a number of defective columns in previous columns.

11. An integrated circuit having a memory module, the memory module comprising:
at least a memory block that includes:
a memory array having regular columns and at least one redundant column, the regular columns and the redundant column extending in a bit-line direction, and being ordered in a word-line direction;
a shift wrapper that interfaces between block inputs/outputs and the regular and redundant columns, the shift wrapper configured to shift a mapping between the block inputs/outputs and the regular and redundant columns to bypass a defective column that has at least one defective cell, and engage the redundant column, while maintaining the order in the word-line direction, wherein the shift wrapper includes:
a plurality of input switches respectively coupled to the regular and redundant columns, an input switch coupled to a non-defective column and configured to selectively couple a block input to the non-defective column, and
a plurality of output switches respectively coupled to the block outputs, an output switch coupled to a block output and configured to selectively couple a non-defective column to the block output.

12. The integrated circuit of claim 11, further comprising:
a controller configured to provide enable signals to the shift wrapper to shift the mapping.

13. The integrated circuit of claim 11, wherein the controller is configured to provide the enable signals that are indicative of the defective column.

14. The integrated circuit of claim 11, wherein
the controller is configured to provide respective enable signals to the plurality of input switches and the plurality of output switches.

15. The integrated circuit of claim 14, wherein
an input switch includes a first multiplexer that selects one out of a number of ordered block inputs; and
an output switch includes a second multiplexer that selects one out of a number of ordered columns.

16. The integrated circuit of claim 15, wherein
the first multiplexer is configured to select one of the ordered block inputs based on at least one of the enable signal to the input switch and a carry-over enable signal from a neighbor input switch.

17. The integrated circuit of claim 15, wherein
the second multiplexer is configured to select one of the ordered columns based on at least one of the enable signal to the output switch and a carry-over enable signal from a neighbor output switch.

* * * * *